(12) United States Patent
Poulet et al.

(10) Patent No.: US 7,283,078 B2
(45) Date of Patent: Oct. 16, 2007

(54) DIGITAL-TO-ANALOG CONVERTER

(75) Inventors: Frédéric Poulet, Vizille (FR); Guillaume Cogniard, Saint Martin d'Heres (FR)

(73) Assignee: Dolphin Integration (FR)

( * ) Notice: Subject to any disclaimer, the term of this patent is extended or adjusted under 35 U.S.C. 154(b) by 0 days.

(21) Appl. No.: 11/446,829

(22) Filed: Jun. 5, 2006

(65) Prior Publication Data

US 2006/0279355 A1  Dec. 14, 2006

(30) Foreign Application Priority Data

Jun. 8, 2005  (FR) ................................. 05 51544

(51) Int. Cl.
*H03M 1/82* (2006.01)

(52) U.S. Cl. ....................... 341/152; 375/238

(58) Field of Classification Search ............... 341/152, 341/144, 143; 375/238, 240, 242
See application file for complete search history.

(56) References Cited

U.S. PATENT DOCUMENTS

| 6,473,457 B1 * | 10/2002 | Pascual et al. ............... 375/238 |
| 6,657,566 B1 * | 12/2003 | Risbo et al. ................... 341/53 |
| 6,933,872 B2 * | 8/2005 | Kranz ........................ 341/144 |
| 6,965,339 B2 * | 11/2005 | Midya et al. ................ 341/163 |
| 7,058,464 B2 * | 6/2006 | Mallinson ..................... 700/94 |
| 7,209,067 B1 * | 4/2007 | Melanson .................... 341/155 |
| 2004/0222907 A1 | 11/2004 | Kranz ......................... 341/143 |

OTHER PUBLICATIONS

Nielsen, "High-Fidelity PWM-Based Amplifier Concept For Active Loudspeaker Systems With Very Low Energy Consumption", J. Audio Eng. Soc. vol. 45, No. 7/8, Jul./Aug. 1997, pp. 554-570.
International Search Report (2 pgs).

* cited by examiner

*Primary Examiner*—Peguy JeanPierre
(74) *Attorney, Agent, or Firm*—Plevy, Howard & Darcy, PC

(57) ABSTRACT

A converter of a digital signal into a pulse-width modulated signal, comprising a first conversion unit receiving, at a first frequency, successive digital signals each having one of a first determined number of values, and providing first intermediary signals, at the first frequency, each having one of a second determined number of values smaller than the first determined number; a unit performing a decimation of the first intermediary signals to provide second intermediary signals at a second frequency equal to the first frequency divided by the second determined number minus one; and a second conversion unit providing at the second frequency, from the second intermediary signals, a two-state pulse-width modulated signal having a minimum duration in one of the two states which is equal to the inverse of the first frequency, the first conversion unit receiving the pulse-width modulated signal.

10 Claims, 2 Drawing Sheets

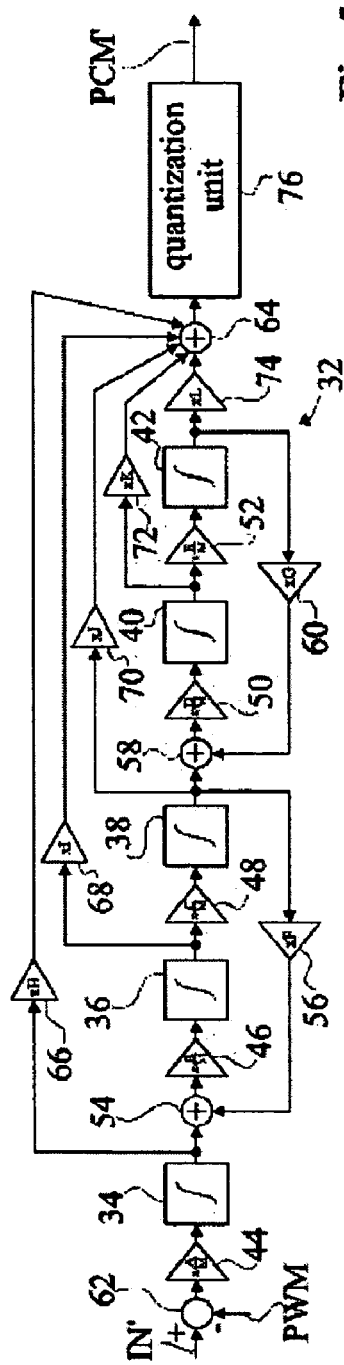
Fig 5
Fig 6
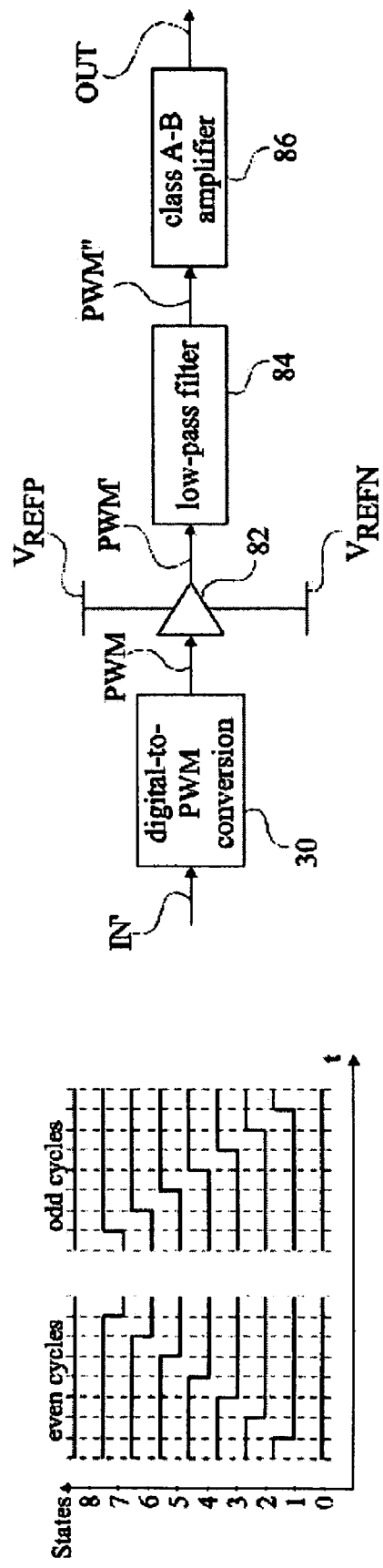
Fig 7

DIGITAL-TO-ANALOG CONVERTER

BACKGROUND OF THE INVENTION

1. Field of the Invention

The present invention relates to a digital-to-analog converter (DAC) of the type providing, from a digital signal, a pulse width modulated signal having its average value corresponding to an analog signal, and to a method for converting a digital signal into a pulse-width modulated signal.

2. Discussion of the Related Art

An example of application of a digital-to-analog converter is the provision of audio signals in which a digital signal is converted into a pulse-width modulated signal to control a loudspeaker. Another example of application relates to the provision, from a digital signal, of a pulse-width modulated signal for the control of a motor.

FIG. 1 shows an example of a digital-to-analog converter 10 for the control of a load 12, for example, a loudspeaker or a motor. Converter 10 receives, at a frequency F1, a digital signal IN corresponding to a succession of coded messages over a determined number of bits, for example, from 16 to 24 bits, and providing, at frequency F1, a two-state pulse-width modulated signal PWM which drives a class-D amplifier 16. Converter 10 is a digital-to-analog converter since the PWM signal, although being a binary signal, has an average value which corresponds to a digital signal. Amplifier 16 provides an amplified signal OUT for the control of load 12. Converter 10 comprises a PCM conversion unit 18, also called noise shaper which receives, at a first input, signal IN and which provides, at frequency F1, a pulse-code modulated digital signal PCM to a PWM conversion unit 20 which provides the PWM signal. The PCM signal is a digital signal, for example, over 3 or 4 bits, enabling coding M+1 values or states. The PCM signal is also provided by a feedback loop 21 to a second input of PCM conversion unit 18. PWM conversion unit 20 is controlled by a periodic control signal CLK from which the PWM signal is provided.

FIG. 2 illustrates an example of variation of the PWM signal according to the different states coded by the PCM signal. In the present example, a PCM signal coding 9 states has been shown (that is, for M equal to 8). Frequency F1 corresponds to the frequency of provision of a new value of the PCM signal by PCM conversion unit 18. The PWM signal is a signal with two high and low states such that during a cycle of duration T1, inverse of frequency F1, the duration of the PWM signal in the high state depends on the PCM signal received by PWM conversion unit 20. Duration T2 corresponds to the minimum time for which the PWM signal can be in the high state or in the low state during a cycle. Duration T2 characterizes the resolution of PWM conversion unit 20 and is equal to T1 divided by M so that the PWM signal can code the M+1 states that the PCM signal can take. To achieve such a resolution, it is necessary for control signal CLK to have a frequency F2, inverse of time T2, equal to M times frequency F1.

Such a digital-to-analog converter associated with a class-D amplifier enables performing a digital-to-analog power conversion while ensuring a high efficiency and a good immunity to electric imperfections of the class-D amplifier.

PCM conversion circuit 18 enables converting a digital signal having a determined number of bits into a digital signal having a smaller number of bits while rejecting part of the quantization noise introduced by such a conversion outside a useful frequency band. The pulse-width modulation being a non-linear process, the conversion of the PCM signal into a PWM signal causes the occurrence of spectral crosstalk components. Since a non-negligible part of the power of the PCM signal provided by PCM conversion unit 18 is present in the form of quantization noise outside of the useful frequency band, the crosstalk components cause a significant increase of the noise level in the useful frequency band on conversion of the PCM signal into a PWM signal. There thus is a degradation of the signal-to-noise ratio at the converter output, in other words, for an audio application, a degradation of the quality of the audio signal provided by loudspeaker 12.

There are two solutions to avoid such disadvantages:

A first solution is to decrease the quantization noise at the output of PCM conversion unit 18 by increasing the number of states that the PCM signal can code. The quantization noise decrease enables decreasing the crosstalk components resulting from the PWM modulation, which limits the degradation of the quality of the PWM signal. However, an increase in the number of states that the PCM signal can code implies an increase in the resolution of the PWM signal and thus requires an increase in the frequency of control signal CLK of PWM conversion unit 20. A disadvantage of such a solution is that the provision of control signal CLK at a high frequency requires use of expensive components, for example, phase-locked loops.

FIG. 3 shows a second solution which provides, at the level of feedback loop 21 which provides the PCM signal at the input of PCM conversion unit 18, a unit with a variable transfer function 22 which models the frequency response of PWM conversion unit 20. PCM conversion unit 18, which behaves as a bandpass filter towards the noise introduced into feedback loop 21, thus filters the noise present in the useful frequency band of the signal provided by variable transfer function unit 22, which provides a PWM signal having an acceptable noise level in the useful frequency band.

A disadvantage of such a solution is that it requires use of a filtering unit 22 for modeling the frequency response of PWM conversion unit 20. Such a transfer function is particularly difficult to model, in particular because it varies for each value that can be taken by the PCM signal. Variable transfer function unit 22 thus generally requires a significant number of logic operations and storage elements and thus exhibits a significant bulk and a non-negligible manufacturing cost.

SUMMARY OF THE INVENTION

The present invention aims at obtaining a converter of a digital signal into a pulse-width modulated signal and a method for converting a digital signal into a pulse-width modulated signal enabling provision of a pulse-width modulated signal having a high signal-to-noise ratio.

Another aspect of the present invention is to provide a digital-to-analog converter formed only of components used for the manufacturing of logic circuits.

For this purpose, it provides a converter of a digital signal into a pulse-width modulated signal, comprising: a first conversion unit receiving, at a first frequency, successive digital signals each having one of a first determined number of values, and providing first intermediary signals, at the first frequency, each having one of a second determined number of values smaller than the first determined number; a unit performing a decimation of the first intermediary signals to provide second intermediary signals at a second frequency equal to the first frequency divided by the second determined number minus one; and a second conversion unit providing at the second frequency, from the second intermediary signals, a two-state pulse-width modulated signal having a minimum duration in one of the two states which is equal to the inverse of the first frequency, the first conversion unit receiving said pulse-width modulated signal.

According to an embodiment of the present invention, the second conversion unit is capable of providing, for an alternation of even and odd cycles at the first frequency, the pulse-width modulated signal such that, on each even cycle, the pulse-width modulated signal comprises at most one falling edge and comprises no rising edge and, on each odd cycle, the pulse-width modulated signal comprises at most one rising edge and comprises no falling edge.

According to an embodiment of the present invention, the first conversion unit is capable of performing a filtering on the difference between the successive digital signals and the pulse-width modulated signal.

According to an embodiment of the present invention, the first conversion unit is capable of providing the first intermediary signals in digital form.

According to an embodiment of the present invention, the converter further comprises a class-D amplifier controlled by the pulse-width modulated signal.

The present invention also provides a method of conversion of a digital signal into a pulse-width modulated signal, comprising the steps of receiving, at a first frequency, successive digital signals each having one of a first determined number of values; providing at the first frequency, from the successive digital signals, first intermediary signals each having one of a second determined number of values smaller than the first determined number; performing a decimation of the first intermediary signals to provide second intermediary signals at a second frequency equal to the first frequency divided by the second determined number minus one; and providing at the second frequency, from the second intermediary signals, a two-state pulse-width modulated signal having a minimum duration in one of its two states equal to the inverse of the first frequency, the first intermediary signals being also provided from said pulse-width modulated signal.

According to an embodiment of the present invention, the pulse-width modulated signal is provided on an alternation of even and odd cycles at the first frequency, such that, on each even cycle, the pulse-width modulated signal comprises at most one falling edge and comprises no rising edge and, on each odd cycle, the pulse-width modulated signal comprises at most one rising edge and comprises no falling edge.

According to an embodiment of the present invention, the first intermediary signals are provided from a filtering of the difference between the successive digital signals and the pulse-width modulated signal.

According to an embodiment of the present invention, the first and second intermediary signals are digital signals.

According to an embodiment of the present invention, the method further comprises the step of controlling a class-D amplifier with the pulse-width modulated signal.

The foregoing aspects, features, and advantages of the present invention will be discussed in detail in the following non-limiting description of specific embodiments in connection with the accompanying drawings.

BRIEF DESCRIPTION OF THE DRAWINGS

FIG. 5 shows a more detailed example of an element of the converter of FIG. 4; and FIG. 6 shows the course of signals provided by a variation of the digital-to-analog converter of FIG. 4.

FIG. 7 shows an example of use of a converter according to an embodiment of the present invention.

DETAILED DESCRIPTION

Figure 1:
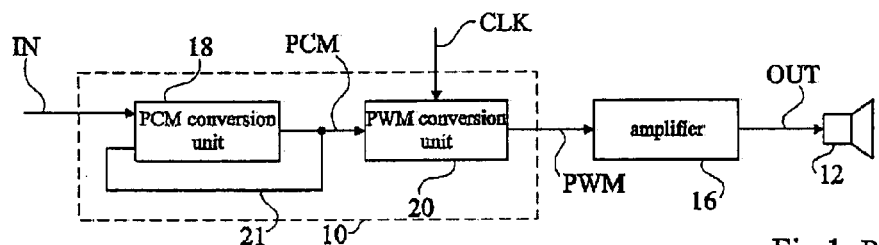
FIG. 1, previously described, shows an example of a circuit for controlling a load comprising a conventional digital-to-analog converter.

For clarity, same elements have been designated with same reference numerals in the different drawings.

One aspect of the present invention comprises the direct provision to the second input of the PCM conversion unit of the PWM signal provided by the PWM conversion unit. This enables direct taking into account by the PCM conversion unit of the noise introduced by the PWM conversion unit. Since the PCM conversion unit acts as a bandpass filter towards noise introduced in the feedback loop, it filters, in the useful frequency band, the noise originating from the PWM conversion unit, which ensures the obtaining of a PWM signal having a minimum noise level in the useful frequency band of the digital-to-analog converter.

Figure 4:
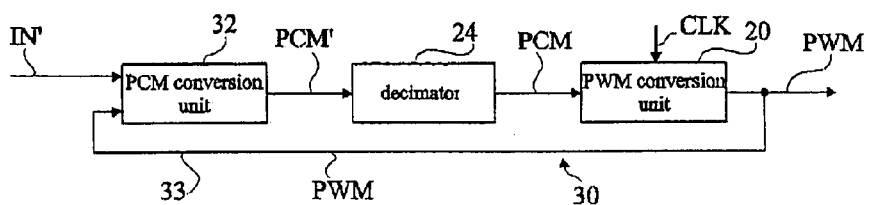
FIG. 4 shows an example of the forming of a digital-to-analog converter according to the present invention.

FIG. 4 shows an example of the forming of a digital-to-analog converter 30 according to the present invention.

Similarly to converter 10 described in FIG. 1, converter 30 comprises a PWM conversion unit 20 which receives, at frequency F1, a pulse-code modulated signal PCM over M+1 states and provides a pulse-width modulated signal PWM at a cyclic frequency F1. The resolution of the PWM signal provided by PWM conversion unit 20 is determined by control signal CLK at frequency F2 equal to M times F1.

Unlike converter 10, converter 30 comprises a PCM conversion unit 32 which receives at a first input a digital input signal IN' at frequency F2 and provides a pulse-code modulated signal PCM' at frequency F2. Signal PCM' is transmitted to a decimator 24 which performs a decimation operation of factor M, for example by selecting a sample of signal PCM' every M samples, and which provides a PCM signal at frequency F1 to PWM conversion unit 20. The PWM signal is provided by a feedback loop 33 to a second input of PCM conversion unit 32. Since the PWM signal is a two-state signal provided in cyclic fashion at frequency F1 and which may occupy a same state for a minimum time period equal to the inverse of frequency F2, it may be directly put in the form of a digital signal transmitted at frequency F2 having the same number of bits as signal IN' to be usable by PCM conversion unit 32. Unlike converter 10 shown in FIG. 1, signal IN' thus is a digital signal provided at frequency F2, equal to M times F1. PCM conversion unit 32 thus operates at a frequency which is M times as high as PCM conversion unit 18 of converter 10. However, the PWM conversion unit 20 of converter 30 according to the present invention may operate identically to converter 10 shown in FIG. 1 and, in particular, may be controlled by control signal CLK at frequency F2. To obtain PCM conversion unit 32 operating at a frequency F2 greater than frequency F1, it is necessary to modify the structure of PCM conversion unit 18.

FIG. 5 shows an example of the forming of PCM conversion unit 32 according to the present invention showing the modifications that can be brought to a conventional PCM unit when its operating frequency is desired to be increased. As an example, a PCM conversion unit 32 which performs a filtering of order 5 and comprises a main line formed of a succession of given integrators 34, 36, 38, 40, and 42 has been shown. Each integrator 34, 36, 38, 40, and 42 is preceded by an amplifier 44, 46, 48, 50, and 52 respectively having an amplification coefficient A/M, B/M, C/M, D/M, and E/M. An adder 54 receives at a first input the signal provided by integrator 34 and at a second input the signal provided by integrator 38, amplified by an amplifier 56 having an amplification coefficient F, and drives amplifier 46. An adder 58 receives at a first input the signal provided by integrator 38 and at a second input the signal provided by integrator 42, amplified by an amplifier 60 having an amplification coefficient G, and drives amplifier 50. PCM conversion unit 32 comprises a subtractor 62 having its positive input receiving signal IN', its negative input receiving the shaped PWM signal, and its output driving amplifier 44. The outputs of integrated 34, 36, 38, 40, and 42 are provided to respective inputs of an adder 64, respectively via amplifiers 66, 68, 70, 72, and 74 having respective amplification coefficients H, I, J, K, and L. Adder 64 drives a quantization unit 76 which provides a pulse-code modulated digital signal PCM' at frequency F2 over a number of bits smaller than the number of bits of signal IN'.

An example of a structure of PCM conversion unit 18 operating at frequency F1 would be the structure shown in FIG. 5 in which the amplification coefficients of amplifiers 44, 46, 48, 50, and 52 would respectively be A, B, C, D, and E, the other amplification coefficients being unchanged. To operate PCM conversion unit 32 at frequency F2 equal to M times F1, a possibility thus is to modify certain amplification coefficients of PCM conversion unit 18 by dividing them by M. In the present example, to obtain PCM conversion unit 32 operating at frequency F2 and have a transfer function substantially equivalent to the transfer function of PCM conversion unit 18 operating at frequency F1, a possibility is to divide, by a factor M, the amplification coefficients of amplifiers 44, 46, 48, 50, and 52, used for an operation at frequency F1. This ensures the stability of PCM conversion unit 32 in an operation at frequency F2.

Figure 2:
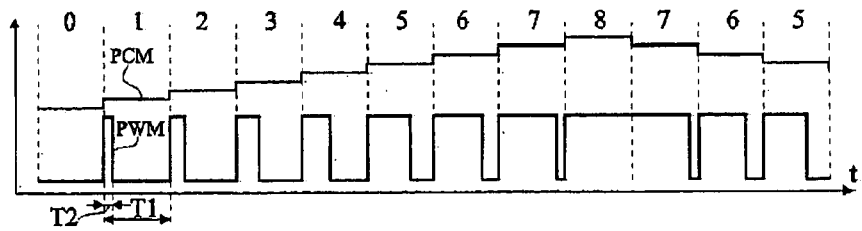
FIG. 2, previously described, shows an example of variation of characteristic signals of the converter of FIG. 1.
Figure 3:
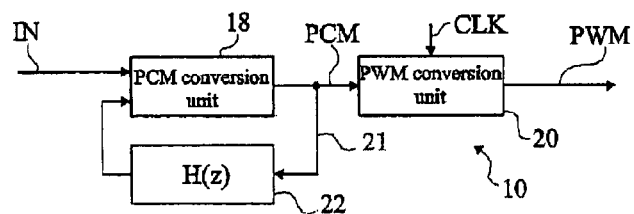
FIG. 3, previously described, shows a conventional example of a digital-to-analog converter enabling providing a signal with a high signal-to-noise ratio.

One aspect of the present invention provides a specific alternative embodiment which enables decreasing the switching frequency of the PWM signal. According to such an alternative embodiment, an even or odd index is successively assigned to the successive cycles at frequency F1 at which PWM conversion unit 20 provides a new PWM signal. For a cycle of even index, PWM conversion unit 20 provides a PWM circuit unmodified with respect to what is illustrated in FIG. 2 and, for an odd cycle, PWM conversion unit 20 provides a PWM signal which is the time-symmetrical of the signal which should have been provided.

In FIG. 6, PWM signals to be transmitted when the PCM signal can code 9 states have been shown. On the right-hand side, the PWM signals provided for an odd cycle have been shown and, on the left-hand side, the PWM signals provided for an even cycle have been shown.

With such a PWM conversion, for each cycle, at most one transition between the high and low states can be observed. With a conventional PWM conversion, there may be two transitions in a cycle, one transition during the cycle and one transition just at the beginning (or at the very end) of the cycle. The fact of decreasing the number of transitions per cycle enables decreasing the switching frequency of signal PWM. This is particularly advantageous when PWM conversion unit 20 drives a class-D amplifier having its consumption directly linked to the switching frequency of the PWM signal. The consumption of the class-D amplifier is thus decreased, which enables improving its power efficiency.

The implementation of the variation of the previously-described embodiment of PWM conversion unit 20 can be envisaged due to the structure of digital-to-analog converter 30 according to the present invention in which the PWM signal is provided, by a feedback loop, to an input of PCM conversion unit 32. Indeed, the use of the alternative PWM conversion unit 20 would be difficult to envisage with the previously-described conventional digital-to-analog converter structures, since it tends to increase the noise level in the useful frequency band of the PWM signal. This is not disturbing with digital-to-analog converter 30 according to the present invention since PCM conversion unit 32 rejects such noise out of the useful frequency band.

Although, in the present invention, PCM conversion unit 32 operates at a frequency F2 higher than the operating frequency of a conventional digital-to-analog converter, and thus consumes more, this is little prejudice since the consumption of PCM conversion unit 32 is low with respect to the consumption of class-D amplifier 16.

An advantage of the present invention is that it may be totally formed with components currently used to form logic circuits and may be implemented with a small number of components (gates, operators, storage elements . . . ).

Another advantage of the present invention is that it enables not increasing the resolution of the PWM conversion unit, that is, not increasing the frequency of the control signal of the PWM conversion unit, which would have required the use of expensive components to provide the control signal, such as phase-locked loops.

FIG. 7 shows an example of use of converter 30 according to the present invention in a digital-to-analog converter receiving digital signal IN' and providing an analog signal OUT for the control of a load, not shown, for example a loudspeaker or a motor. The PWM signal provided by converter 30 drives an amplifier 82 connected to two sources of reference voltages $V_{REFP}$ and $V_{REFN}$. Amplifier 82 provides a signal PWM' which drives a temporally continuous low-pass filter 84. Filter 84 provides a signal PWM" to a power amplifier 86, for example, a class-A-B amplifier, which provides signal OUT.

Amplifier 82 is a low-power amplifier. It converts digital signal PWM into an analog signal PWM' at low power according to the following relation:

$$PWM'=PWM \times V_{REFP}$$

The electric current provided by amplifier 82 is low given that low-pass filter 84 receiving signal PWM' has a strong input impedance. Reference voltage source $V_{REFP}$ is a source capable of providing a "natural" voltage enabling obtaining a high signal-to-noise ratio SNR. Further, voltage source $V_{REFP}$ may be selected to obtain a non-zero power supply rejection ratio (PSRR), for example, of approximately 50 dB. This is particularly advantageous since it enables directly using a portable phone battery to power the digital-to-analog converter.

Continuous-time low-pass filter 84 for example is a filter of second or third order and enables suppressing the wide band noise of analog signal PWM' to only keep the wanted signal, for example, the signal present in the audio band. Filter 84 may comprise an amplifier, for example, an operational amplifier. For the performances of such an amplifier not to be altered by the presence of the wide-band noise contained in analog signal PWM' (due to the risk of crosstalk of the high-frequency noise), it is advantageous for the low-pass filter to then comprise, at its input, at least one RC-type passive filter.

Of course, the present invention is likely to have various alterations, modifications, and improvements which will readily occur to those skilled in the art. In particular, the present invention may be implemented with a PCM conversion unit having a structure different from that shown in FIG. 5. In particular, the order of the PCM conversion unit is adapted to the desired processing of digital signal IN'.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A converter of a digital signal into a pulse-width modulated signal, comprising:
    a first conversion unit receiving, at a first frequency, successive digital signals each having one of a first determined number of values, and providing first intermediary signals, at the first frequency, each having one of a second determined number of values smaller than the first determined number;
    a unit performing a decimation of the first intermediary signals to provide second intermediary signals at a second frequency equal to the first frequency divided by the second determined number minus one; and
    a second conversion unit providing at the second frequency, from the second intermediary signals, a two-state pulse-width modulated signal having a minimum duration in one of the two states which is equal to the inverse of the first frequency, the first conversion unit receiving said pulse-width modulated signal.

2. The converter of claim 1, wherein the second conversion unit is capable of providing, for an alternation of even and odd cycles at the first frequency, the pulse-width modulated signal such that, on each even cycle, the pulse-width modulated signal comprises at most one falling edge and comprises no rising edge and, on each odd cycle, the pulse-width modulated signal comprises at most one rising edge and comprises no falling edge.

3. The converter of claim 1, wherein the first conversion unit is capable of performing a filtering on the difference between the successive digital signals and the pulse-width modulated signal.

4. The converter of claim 1, wherein the first conversion unit is capable of providing the first intermediary signals in digital form.

5. The converter of claim 1, further comprising a class-D amplifier controlled by the pulse-width modulated signal.

6. A method of conversion of a digital signal into a pulse-width modulated signal comprising the steps of:
    receiving, at a first frequency, successive digital signals each having one of a first determined number of values;
    providing at the first frequency, from the successive digital signals, first intermediary signals each having one of a second determined number of values smaller than the first determined number;
    performing a decimation of the first intermediary signals to provide second intermediary signals at a second frequency equal to the first frequency divided by the second determined number minus one; and
    providing at the second frequency, from the second intermediary signals, a two-state pulse-width modulated signal having a minimum duration in one of its two states equal to the inverse of the first frequency, the first intermediary signals being also provided from said pulse-width modulated signal.

7. The method of claim 6, wherein the pulse-width modulated signal is provided on an alternation of even and odd cycles at the first frequency, such that, on each even cycle, the pulse-width modulated signal comprises at most one falling edge and comprises no rising edge and, on each odd cycle, the pulse-width modulated signal comprises at most one rising edge and comprises no falling edge.

8. The method of claim 6, wherein the first intermediary signals are provided from a filtering of the difference between the successive digital signals and the pulse-width modulated signal.

9. The method of claim 6, wherein the first and second intermediary signals are digital signals.

10. The method of claim 6, further comprising the step of controlling a class-D amplifier with the pulse-width modulated signal.

* * * * *